United States Patent [19]
Gongwer et al.

[11] Patent Number: 5,155,393
[45] Date of Patent: Oct. 13, 1992

[54] CLOCK SELECTION FOR STORAGE ELEMENTS OF INTEGRATED CIRCUITS

[75] Inventors: Geoffrey S. Gongwer, San Jose; Keith H. Gudger, Sunnyvale, both of Calif.

[73] Assignee: Atmel Corporation, San Jose, Calif.

[21] Appl. No.: 755,686

[22] Filed: Sep. 6, 1991

[51] Int. Cl.⁵ .................. H03K 19/00; H03K 5/13
[52] U.S. Cl. ..................... 307/480; 301/269; 301/465
[58] Field of Search ............... 307/480, 269, 465

[56] References Cited

U.S. PATENT DOCUMENTS

| | | | |
|---|---|---|---|
| 4,011,465 | 3/1977 | Alvarez, Jr. ................ | 307/208 |
| 4,740,721 | 4/1988 | Chung et al. ................ | 307/468 |
| 4,760,280 | 7/1988 | Schwefel et al. ............ | 307/269 |
| 4,797,574 | 1/1989 | Okubo et al. ................ | 307/269 |
| 4,841,174 | 6/1989 | Chung et al. ................ | 307/469 |
| 4,912,342 | 3/1990 | Wong et al. ................ | 307/465 |
| 4,914,325 | 4/1990 | Yamada ...................... | 307/269 |
| 4,933,571 | 6/1990 | Pribyl ........................ | 307/272.1 |
| 4,942,318 | 7/1990 | Kawana ...................... | 307/465 |
| 4,969,121 | 11/1990 | Chan et al. .................. | 307/465 |

Primary Examiner—Edward P. Westin
Assistant Examiner—Andrew Sanders
Attorney, Agent, or Firm—Schneck & McHugh

[57] ABSTRACT

A clock circuit having a logic gate with an output supplying a clock signal to a clock input of a storage element and with plural inputs, including an input connected to an external contact for receiving an external clock signal and an input connected to a logic circuit to receive a logic term, such as a product term or sum-of-products term. The logic gate logically combines the internally generated logic with the external clock signal to produce the clock signal for the storage element. The logic gate may be an AND, OR, NAND or NOR gate. A multiplexer with an output connected to an input of the logic gate and responsive to a control signal may select one of two or more logic terms, one of two or more external clock signals, or a fixed voltage signal.

3 Claims, 4 Drawing Sheets

CLOCK SELECTION FOR STORAGE ELEMENTS OF INTEGRATED CIRCUITS

TECHNICAL FIELD

The present invention relates to integrated circuit (IC) devices or chips, especially programmable logic devices (PLDs), including one or more storage elements or registers, such as flip-flops, as a component thereof, and in particular relates to clocking arrangements capable of providing at least synchronous operation of the storage element or elements.

BACKGROUND ART

In Wong et al. U.S. Pat. No. 4,912,342, describe a programmable logic device (PLD) having a logic array block, providing a plurality of product term signals which are a logic function (AND) of the interconnected word lines, and a macrocell block receiving the product term signals for logically combining, storing, feeding back or outputting at least some of those product term signals. The macrocell block includes a flip-flop structure with a data input D receiving a signal that is a combination (OR/NOR) of several product term signals, an output Q and a clock input receiving an applied clock signal CLK, according to which the flip-flop structure will operate in either a combinatorial, asynchronous or synchronous mode. The applied clock signal CLK is provided by an OR gate that logically combines a first signal LABCLK and a product term signal ACLK. For combinatorial operation, flip-flop preset and reset signals P and C are simultaneously active (low) and the product term signal ACLK is programmed to be always 1, so that the applied clock signal CLK on the flip-flop's clock input is a constant logic signal 1. For asynchronous operation, the first signal LABCLK is programmed to be always 0, so that the applied clock signal CLK on the flip-flop's clock input is the product term signal ACLK, a function of the present states of word line variables in the logic array block. For synchronous operation, the product term signal ACLK is programmed to be always 0, so that the applied signal CLK on the flip-flop's clock input is an external clock signal EXT(SYNC)CLK provided on the LABCLK line by an input pad of the device. In this manner, the clocking of the flip-flop is programmable to select either combinatorial, asynchronous or synchronous mode operation of that flip-flop.

Certain non-programmable configurations for synchronizing clock signals and data signals for flip-flops and other storage elements are known. For example, in Pribyl U.S. Pat. No. 4,933,571, describes a circuit in which a data signal D is input into a flip-flop through a transfer gate controlled by a clock signal CLK. Data is thereby synchronized with the clock, preventing metastable conditions. In Alvarez, Jr. U.S. Pat. No. 4,011,465, describes a circuit in which a latch is driven by a data-modulated clock signal. The data-modulated clock signal is provided by an AND gate that logically combines an asynchronous data signal $S_{IN}$ with a clock signal $\phi_1$. In Chunk et al. U.S. Pat. No. 4,740,721 and 4,841,174, describe a programmable logic array (PLA) and a circuit that may be implemented in a PLA which uses a clock signal CK and its complement CK to synchronize the dynamic logic operations of the logic gates in the PLA. Both the NAND and NOR planes of the PLA feed into latches. The clock signal not only controls the latches, but also logically combines with the terms of the planes of logic gates.

With reference to FIGS. 12–15, clock circuits of the prior art used for providing a clock signal CLK to a storage element, such as a flip-flop, are shown. In FIG. 12, a line 101 connected directly to an external contact or pin 102 of an integrated circuit device supplies an external clock signal EXT CLK as the clock signal CLK to be used by a storage element. This scheme has been used, for example, in Atmel Corporation's 22V10 programmable logic device. In FIG. 13, a line 103 conducts a product term signal P.T. provided by a logic circuit portion of the integrated circuit to a storage element to be used as its clock signal CLK. The product term signal P.T., and thus the clock signal CLK, will vary according to the inputs received by the logic circuit portion of the integrated circuit, causing an asynchronous operation of storage element. This scheme is used, for example, in Atmel Corporation's V750 and V2500 programmable logic devices. In FIG. 14, one conductive line 104 is connected to an external contact of an integrated circuit to receive an external clock signal EXTCLK from outside of the device. Another conductive line 106 receives a product term from a logic circuit portion of the integrated circuit that varies as a function of inputs to the logic circuit. A multiplexer 107 receives both signals on its inputs, namely conductive lines 104 and 106, and selects one of them to be connected to and transmitted over an output 108. The output 108 carries the selected signal as a clock signal CLK to a storage element. This circuit, which allows programmable synchronous or asynchronous operation of a storage element, is used, for example, in Altera Corporation's EP5xxx series of devices. In FIG. 15, another clock circuit also uses a multiplexer 109 to select one of two signals, an external clock signal EXTCLK from an external contact and an internally generated logic term S.O.P. from a logic circuit, as the clock signal CLK provided to a storage element of the integrated circuit. However, unlike the circuit in FIG. 14, this circuit uses a sum-of-products signal S.O.P. as the logic term instead of a product term P.T. The sum-of-products signal S.O.P. is generated by combining two or more product term signals P.T.#1 and P.T.#2 from an AND array of the logic circuit in an OR gate 110. The resulting output is the sum-of-products signal S.O.P. that could be selected by the multiplexer 109. This circuit is used, for example, in Intel Corporation's SAC312 device.

As clock speeds employed for integrated circuits increase, it is desirable that chip performance, measured by parameters such as time from clock to output $t_{CO}$, increase accordingly, so that logic generation can keep up with the faster clock. It is also desirable that integrated circuits be sufficiently flexible that storage elements in the circuits, such as flip-flops, are operable in either a synchronous or asynchronous mode, as selected by the user. For this reason, clock circuits for providing clock signals to such storage elements have been made programmable, as in FIGS. 14 and 15. However, such flexibility is a potential source of delay, such that the storage elements must wait for the generation of the clock logic after signals are provided at the contacts or pins of the device.

A more efficient clock circuit providing programmable synchronous versus asynchronous clocking of integrated circuit storage elements is sought.

SUMMARY OF THE INVENTION

The above object is met with a clock circuit for an integrated circuit which includes a logic gate with an input coupled to an external contact for receiving an external clock signal from outside of the integrated circuit and with another input coupled to a logic circuit portion of the integrated circuit for receiving a logic term therefrom. The logic gate, such as an AND, OR, NAND or NOR gate, logically combines the external clock signal with the logic term to produce a clock signal on its output for use by a storage element. The invention thus enables internal logic to gate the synchronous clock input. There is simultaneous control of the clock by both the external contact and the internal logic. The gain is efficiency, since there is no delay based on generation of the logic term.

BEST MODE FOR CARRYING OUT THE INVENTION

Figure 1:
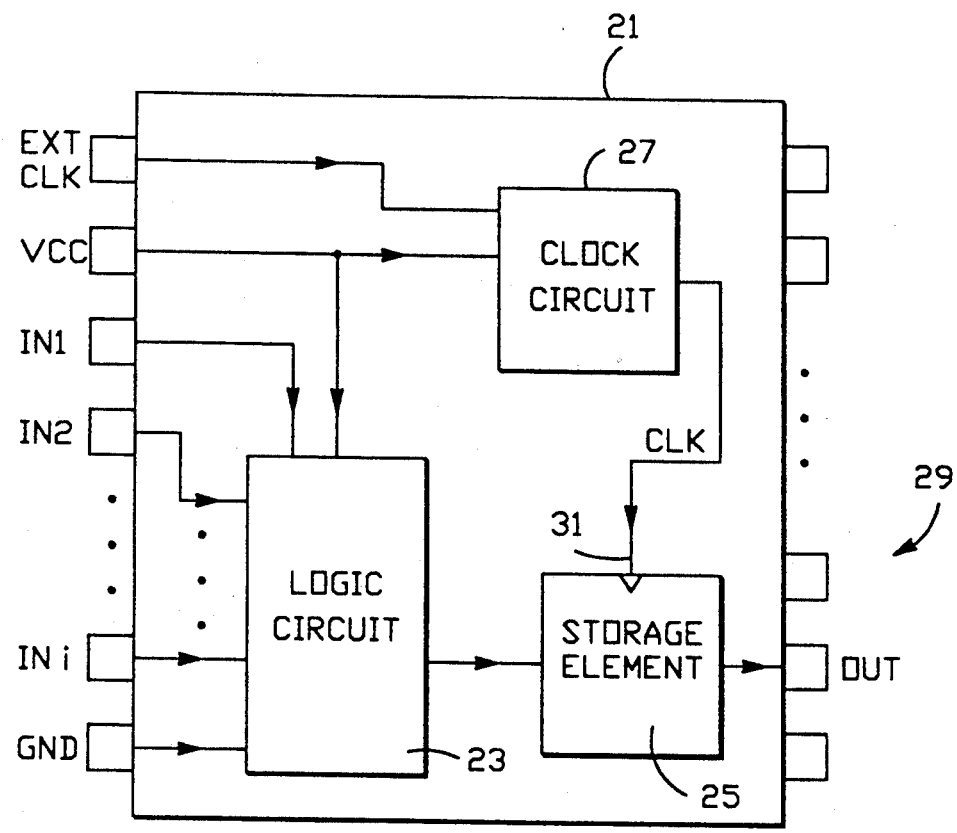
FIG. 1 is a plan view of a typical layout of an integrated circuit of the present invention.
Figure 2:
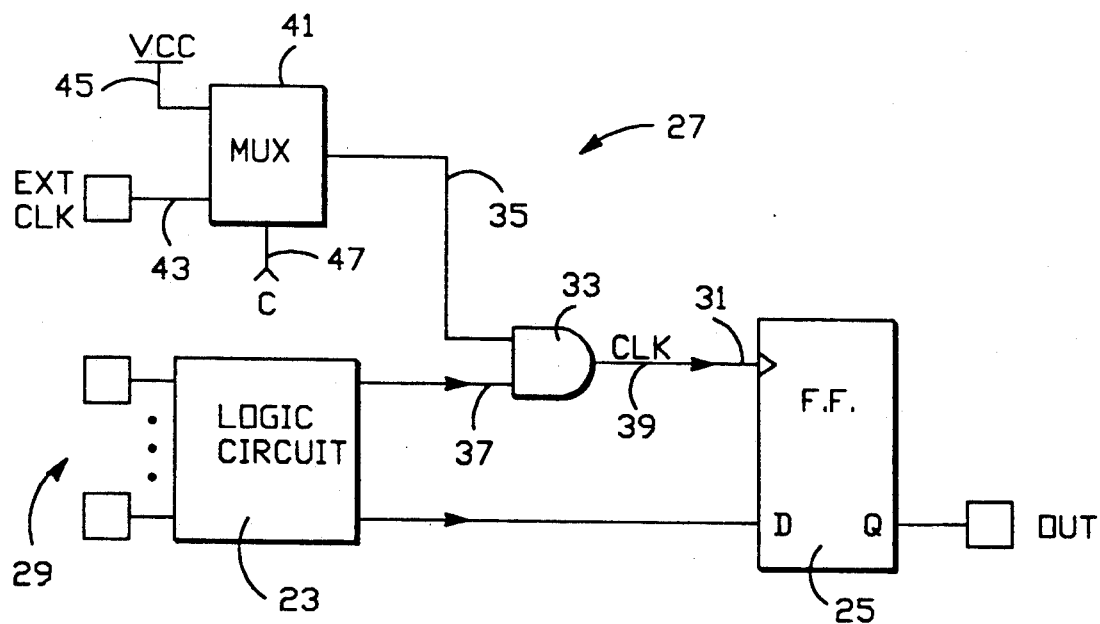
FIG. 2 is a schematic block diagram of a preferred clock circuit for the integrated circuit of FIG. 1.

With reference to FIGS. 1 and 2, an integrated circuit 21 in accord with the present invention includes a logic circuit 23, at least one storage element 25 and a clock circuit 27, all coupling to external contacts 29 of the device 21. Contacts 29, which may be pins, pads, leads or another means for communicating signals into or out of the device 21, typically include one or more inputs IN1, IN2, . . . , INi and outputs OUT, that can be either unidirectional or bidirectional, power supply and ground planes VCC and GND, and one or more contacts EXTCLK dedicated to receiving one or more external clock signals from outside of the integrated circuit. Typically, the logic circuit 23 is a state machine, such as a programmable logic device having an AND array producing product terms followed by an OR array providing logic terms in sum-of-products form. It may receive inputs from contacts IN1, IN2, . . . , INi and provide one or more logic outputs that are some function of the inputs. Outputs of the logic circuit 23 may be transmitted to contacts OUT, either directly or via one or more storage elements 25, may be fed back into the logic circuit 23 or provide logic signals to the clock circuit 27.

Each of the one or more storage elements 25, such as a flip-flop, has a clock input 31 governing its operation. The clock circuit 27 supplies a clock signal CLK to the clock input 31 of the storage element 25. A preferred clock circuit 27 of the present invention has a logic AND gate 33 with a first input 35 coupled through a multiplexer 41 to an external contact EXTCLK of the integrated circuit for receiving an external clock signal, a second input 37 coupled to the logic circuit 23 for receiving a logic term therefrom and an output 39 connected to the clock input 31 of the storage element 25 for delivering the clock signal CLK to the storage element 25. The multiplexer 41, through which the external clock signal on contact EXTCLK is couplable to logic AND gate 33, has two inputs 43 and 45, one input 43 connected to the contact EXTCLK, the other connected to a power supply line 45 of a fixed voltage level $V_{CC}$, and also has an output connected to the corresponding input 35 of the logic AND gate. Multiplexer 41 has control means, such as a control input 47 receiving a control signal C that is programmable according to well known techniques, such as by a CMOS floating gate memory cell, for selecting one of the inputs 43 and 45 of the multiplexer 41 for connection and transmission to the output 35 of the multiplexer 41.

In operation, the multiplexer 41 may be programmed via control input 47 to select the power supply input 45 at constant voltage $V_{CC}$, corresponding to logic level "1" of the AND gate 33. In this case, the clock signal CLK on output 39 is simply the same as the logic term provided on input 37 from the logic circuit 37. In other words, the clock signal CLK provided to clock input 31 of the storage element 25 is an asynchronous signal which varies as a function of changes on selected inputs 29 to the logic circuit 23. Alternatively, the multiplexer 41 may be programmed via control input 47 to select the external clock input 43 nd the logic circuit 23 may be programmed so that the logic, term provided on input 37 to the AND gate 33 is always a logic "1". In this case, the clock signal CLK on output 39 is the same as the external clock signal. In other words, the storage element 25 operates synchronously with the external clock signal provided at the contact EXTCLK. As another alternative, the multiplexer 41 may be programmed to select the external clock input 43 and the input 37 from the logic circuit 23 may also vary as a function of the input signals provided to the logic circuit 23. In this case, the two inputs are logically combined by the AND gate 33 such that the clock signal CLK on output 39 of the AND gate 39 is that of the external clock signal whenever the logic term on input 37 happens to be at logic level "1" and is equal to logic level "0" whenever input 37 is logic level "0". In other words, the storage element 25 operates synchronously with the external clock signal when on, but may be turned on or off according to input conditions programmed in the logic circuit 23.

Figure 3:
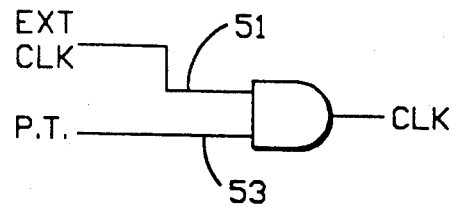
FIGS. 3-11 are schematic block diagrams of alternate clock circuit embodiments of the present invention for the integrated circuit of FIG. 1.

With reference to FIGS. 3-11, a number of alternative clock circuit embodiments are possible. FIG. 3 illustrates that the external contact EXTCLK dedicated to receiving an external (synchronous) clock signal may be directly connected to an AND gate input 51, instead of being coupled through a multiplexer. This eliminates the asynchronous option provided by the fixed voltage connection 41 in FIG. 2, but still allows the turning on or off of a storage element according to input conditions through the logical combining of the external clock signal with a programmable logic term, such as a product term P.T., on input 53 from the logic circuit.

Figure 4:
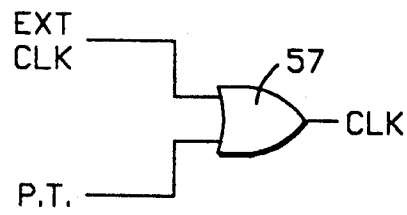
Figure 5:
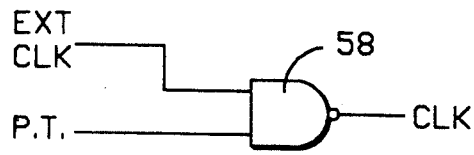
Figure 6:
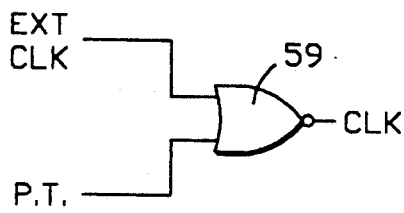

FIGS. 4-6 show that other logic gates, including OR, NAND and NOR gates 57-59, may be used instead of the AND gate 33 of FIG. 2. The NOR gate 59 in FIG. 6 operates the same way as the AND gate in FIG. 3 except that the storage element is turned off when the product term input P.T. is logic level "1" and operates synchronously when product term input P.T. is logic level "0".

Figure 7:
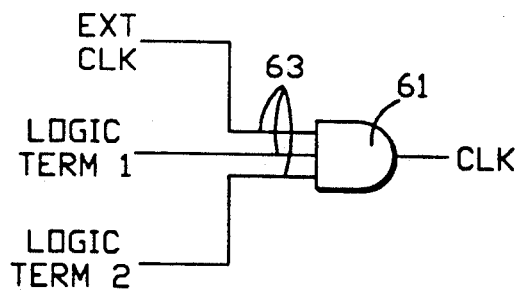

FIG. 7 illustrates that the logic gate 61 of a clock circuit can have more than two inputs 63. However, for purposes of this invention, at least one input EXTCLK must be an external clock signal input coupled to an external contact of the integrated circuit and at least one of the other inputs must be an internal logic term input LOGICTERM1 coupled to a logic circuit part of the integrated circuit. The other inputs can be either internal logic term inputs LOGICTERM2 or inputs connected to external contacts. The inputs, including the at least one external clock signal input EXTCLK and the at least one internal logic term input LOGICTERM1, will be logically combined by the logic gate 61 to form the clock signal CLK for the storage element of the integrated circuit.

Figure 8:
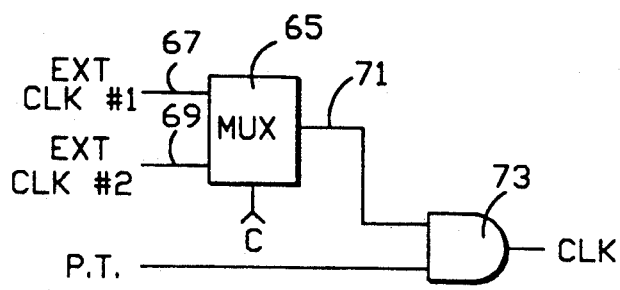

In FIG. 8, the logic gate 73 is coupled to a selected one of two external clock signals received from external contacts EXTCLK#1 and EXTCLK#2. A multiplexer 65 has a pair of inputs 67 and 69 connected to the external contacts EXTCLK#1 and EXTCLK#2, respectively, and an output 71 connected to an input of the logic gate 73. A logic term, such as a product term P.T., from the logic circuit of the integrated circuit is connected to another input of the logic gate 73. The multiplexer 65 also has a control input receiving a programmed control signal C. Responsive to the control signal C, the multiplexer 65 selects one of its inputs 67 and 69 to connect to the output 71 and thus be input into the logic gate 73. Multiplexer 65 could also have more than two external clock inputs. In this way, different clock signals are available for use by the clock circuit.

Figure 9:
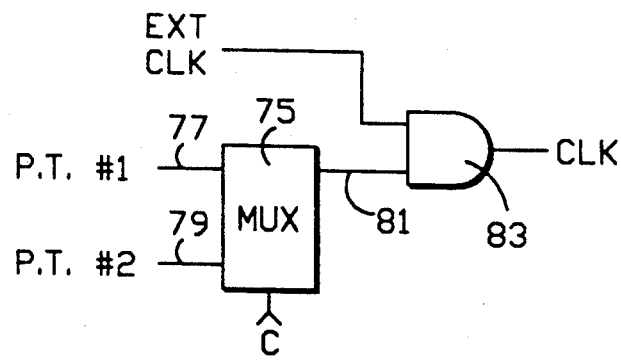

FIG. 9 shows that the internal logic term input 81 to the logic gate 83 may also be selected from plural logic terms provided by the logic circuit of the integrated circuit. In FIG. 9, two product terms P.T.#1 and P.T.#2 are presented on a pair of inputs 77 and 79 to a multiplexer 75. The multiplexer 75 is responsive to a control input C to connect one of the two inputs 77 and 79 to the output 81, which in turn is connected to the logic term input term 81 of the logic gate 83. The logic gate 83 logically combines the selected product term P.T.#1 or P.T.#2 with an external clock signal from an external contact EXTCLK of the integrated circuit, the combined signal forming the clock output CLK to be used by a storage element of the integrated circuit.

Figure 10:
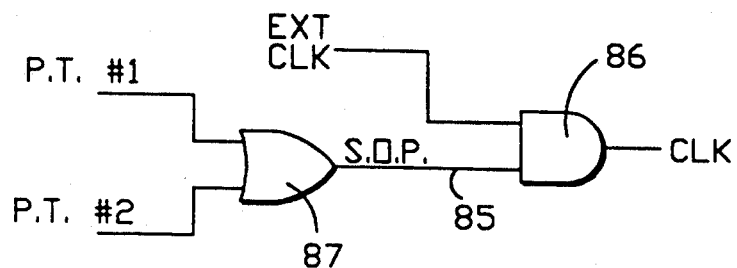

FIG. 10 shows that the internal logic term input 85 to the logic gate 86 need not be a product term generated by a logic AND operation on selected inputs or their logical complements, but can also be a sum-of-products term S.O.P. generated by combining two or more product terms P.T.#1 and P.T.#2 in a second level of logic, such as by an OR gate 87. Both product terms and sum-of-product terms are most easily produced by logic circuits that are of the programmable logic device type having an AND array followed by an OR array. In such cases, product terms are generated by programming the AND array to combine selected inputs thereto, while sum-of-product terms are generated as the outputs of OR gates (with either fixed or programmable product term inputs) in the OR array. Using a second level of logic to provide a sum-of-products input S.O.P. to the logic gate 86 of the clock circuit enables more complex conditions for turn on and turn off of a storage element to be programmed.

Figure 11:
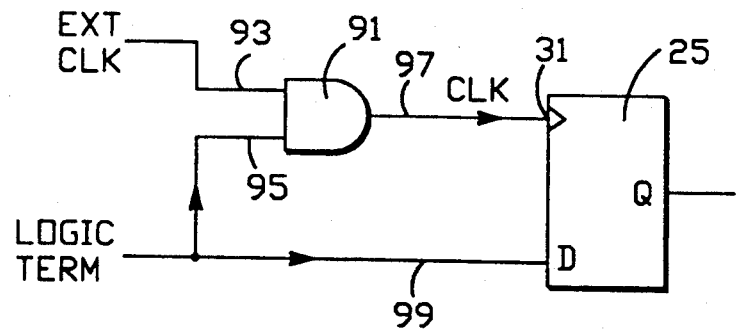
Figure 12:
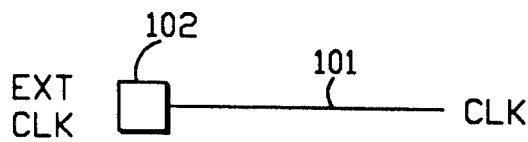
FIGS. 12-15 are schematic block diagrams of prior art clock circuits used in integrated circuits of the prior art.
Figure 13:
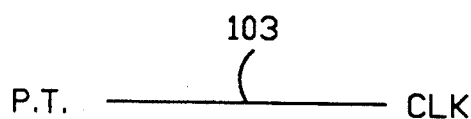

In FIG. 11, the clock circuit has a logic AND gate 91 with two inputs 93 and 95 and an output 97 providing a clock signal CLK to a clock input 31 of a storage element 25 of the integrated circuit. First input 93 is connected to an external contact EXTCLK of the integrated circuit for receiving a clock signal from outside of the device. Second input 95 is connected to receive a logic term signal LOGICTERM, such as a product term or sum-of-products term, from a logic circuit of the integrated circuit. The data input D of the storage element 25 is also connected to receive the sum logic term signal LOGICTERM from the logic circuit. FIG. 11 illustrates that while normally the logic term combined in the logic gate 91 with the external clock to form the clock input signal CLK of the storage element 25 is distinct from the logic term input into the data input of the storage element 25, as in FIG. 2, it could also be the same logic term, if desired.

Figure 14:
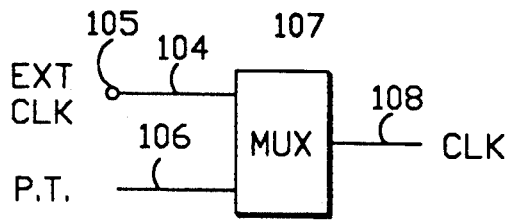
Figure 15:
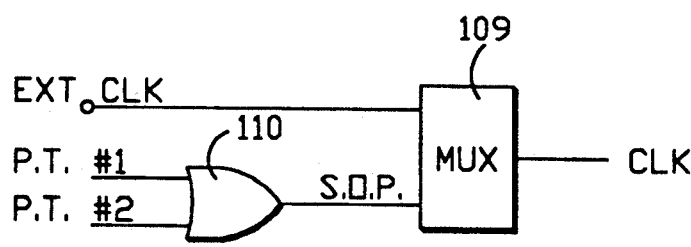

FIGS. 12-15 represent typical clock circuits of the prior art. While those circuits depicted in FIGS. 14 and 15 give the user a choice of clock signals between an external clock signal (synchronous) on an external contact of the integrated circuit and an internally generated logic term signal (asynchronous), the option of combining the two signals to produce the clock signal for storage element has not been previously available. The present invention gives simultaneous control of a clock by both the external clock presented at a contact and the internal logic with efficient clock selection as the result.

We claim:

1. In an integrated circuit having at least one storage element with a clock input, a clock circuit part of said integrated circuit for supplying a clock signal to said clock input of said storage element, the clock circuit comprising a logic gate having a plurality of inputs and an output, said output of said logic gate supplying said clock signal and connected to said clock input of said storage element for delivering said clock signal thereto, at least one of said plurality of inputs of said logic gate coupled to an external contact of the integrated circuit so as to be capable of receiving an external clock signal from outside of the integrated circuit, at least one other of said plurality of inputs of said logic gate coupled to a logic circuit of part of said integrated circuit for receiving a product term selected from a plurality of product terms from said logic circuit by a multiplexer responsive to a control signal, said multiplexer having a plurality of inputs connected to said logic circuit to receive said plurality of product terms and an output connected to an input of said logic gate.

2. In an integrated circuit having at least one storage element with a clock input, a clock circuit part of said integrated circuit for supplying a clock signal to said clock input of said storage element, the clock circuit comprising a logic gate having a plurality of inputs and an output, said output of said logic gate supplying said clock signal and connected to said clock input of said storage element for delivering said clock signal thereto, at least one of said plurality of inputs of said logic gate coupled to an external contact of the integrated circuit so as to be capable of receiving an external clock signal from outside of the integrated circuit, at least one other of said plurality of inputs of said logic gate coupled to a logic circuit part of said integrated circuit for receiving a logic term therefrom, said logic term being connected to both said input of said logic gate and a data input of the storage element.

3. A method of supplying a clock signal to a clock input of a storage element in an integrated circuit comprising receiving an externally generated clock signal from outside of the integrated circuit at an external contact of the integrated circuit, generating a plurality of product terms in a logic circuit part of the integrated circuit, and selecting one of said product terms as a logic term, logically combining said externally generated clock signal with said logic term to form a combined clock signal, and applying said combined clock signal to said clock input of said storage element in said integrated circuit.

* * * * *